US00RE50090E

(19) United States
(12) Reissued Patent
Yamamoto

(10) Patent Number: US RE50,090 E
(45) Date of Reissued Patent: Aug. 20, 2024

(54) SEMICONDUCTOR CIRCUIT DEVICE, OSCILLATOR, ELECTRONIC APPARATUS, AND MOVING OBJECT

(71) Applicant: SEIKO EPSON CORPORATION, Tokyo (JP)

(72) Inventor: Takehiro Yamamoto, Suwa (JP)

(73) Assignee: SEIKO EPSON CORPORATION, Tokyo (JP)

(21) Appl. No.: 17/474,452

(22) Filed: Sep. 14, 2021

Related U.S. Patent Documents

Reissue of:
(64) Patent No.: 9,634,672
Issued: Apr. 25, 2017
Appl. No.: 14/993,733
Filed: Jan. 12, 2016

(30) Foreign Application Priority Data

Jan. 22, 2015 (JP) ..... 2015-010414

(51) Int. Cl.
*H03L 1/02* (2006.01)
*H03B 5/04* (2006.01)
*H03B 5/32* (2006.01)
*H03B 5/36* (2006.01)

(52) U.S. Cl.
CPC ..... *H03L 1/02* (2013.01); *H03B 5/04* (2013.01); *H03B 5/32* (2013.01); *H03B 5/362* (2013.01); *H03B 5/364* (2013.01); *H03B 5/368* (2013.01)

(58) Field of Classification Search
CPC ..... H03L 1/02; H03L 7/0992; H03B 5/364
See application file for complete search history.

(56) References Cited

U.S. PATENT DOCUMENTS 3,568,060 A * 3/1971 Howells ..... H01J 47/10 368/118
3,571,727 A * 3/1971 Lombardi ..... H03K 23/58 326/14
3,631,429 A * 12/1971 King ..... G11B 20/1423
7,471,162 B2 12/2008 Ishikawa et al.
2007/0176691 A1* 8/2007 Batchelor ..... H03L 7/23 331/16
2007/0247249 A1 10/2007 Ishikawa et al.
2008/0169948 A1* 7/2008 Okamoto ..... H03G 5/16 341/118

(Continued)

FOREIGN PATENT DOCUMENTS

JP 2007-067967 A 3/2007
JP 2007-295302 A 11/2007
JP 2013-183212 A 9/2013

*Primary Examiner* — Nick Corsaro
(74) *Attorney, Agent, or Firm* — Oliff PLC

(57) ABSTRACT

A semiconductor circuit device includes an oscillation circuit, an output circuit that receives a signal output from an oscillation circuit and outputs an oscillation signal, a temperature sensing element, a characteristic adjustment circuit that adjusts characteristics of the oscillation circuit on the basis of a signal output from the temperature sensing element, and a first connection terminal that is electrically connected to the output circuit and via which the oscillation signal is output, in which a distance between the output circuit and the first connection terminal is shorter than a distance between the temperature sensing element and the first connection terminal in a plan view.

23 Claims, 13 Drawing Sheets

(56) References Cited

U.S. PATENT DOCUMENTS

| | | | | |
|---|---|---|---|---|
| 2011/0234325 | A1* | 9/2011 | Tanaka | H03L 1/022 331/68 |
| 2013/0285640 | A1* | 10/2013 | Yamada | G01R 22/061 331/25 |
| 2014/0077888 | A1* | 3/2014 | Iwasa | H01L 23/49575 331/66 |
| 2014/0139293 | A1* | 5/2014 | Tsangaropoulos | H03L 7/0994 331/48 |
| 2015/0028960 | A1* | 1/2015 | Yorita | H03L 1/026 331/176 |

* cited by examiner

| DECIMAL NOTATION | VOUT_ADJ<1> | VOUT_ADJ<0> | Vdac(V) | Vclip(V) |
|---|---|---|---|---|
| 0 | 0 | 0 | 0.67 | 0.8 |
| 1 | 0 | 1 | 0.75 | 0.9 |
| 2 | 1 | 0 | 0.83 | 1.0 |
| 3 | 1 | 1 | 0.91 | 1.1 |
FIG. 5
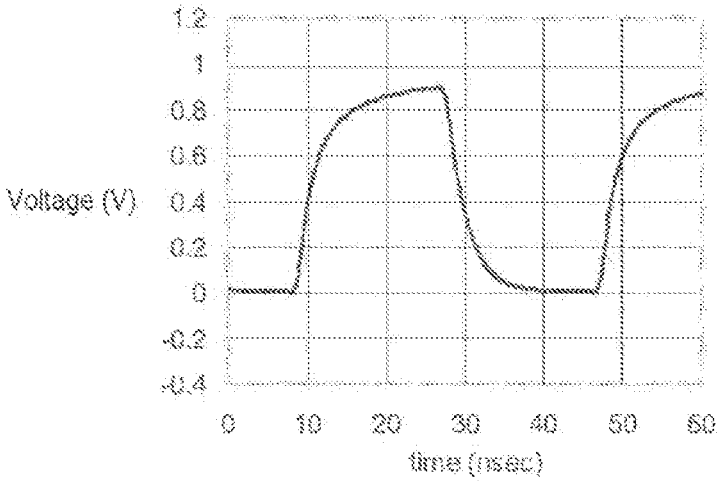
FIG. 6A
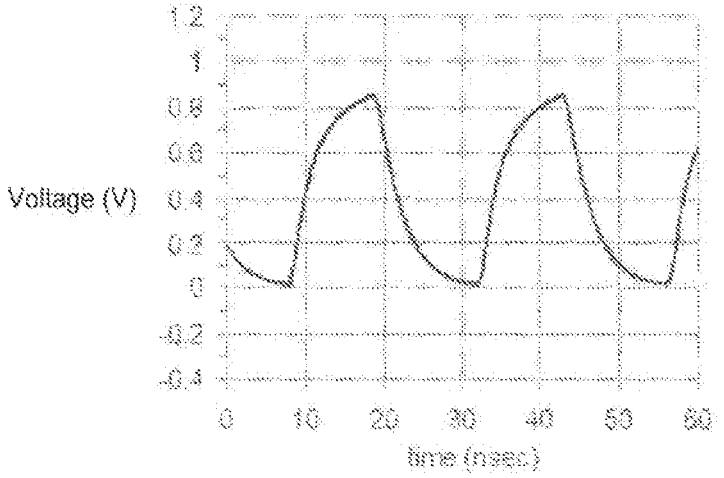
FIG. 6B

SEMICONDUCTOR CIRCUIT DEVICE, OSCILLATOR, ELECTRONIC APPARATUS, AND MOVING OBJECT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE*

*This is an application for reissue of U.S. patent application Ser. No. 14/993,733.*

BACKGROUND

1. Technical Field

The present invention relates to a semiconductor circuit device, an oscillator, an electronic apparatus, and a moving object.

2. Related Art

In an AT cut quartz crystal resonator constituting a temperature compensated crystal oscillator (TCXO), a frequency fluctuates while drawing a curve approximated to a cubic curve which has an inflection point around 25° C. due to a change in ambient temperature. An oscillation circuit and the like constituting the oscillator also have temperature characteristics, and thus a frequency fluctuates due to influences thereof. In the TCXO, a voltage signal for compensating for the frequency fluctuation is generated by a temperature compensation circuit and is applied to a varicap diode provided in the oscillation circuit. Therefore, the frequency fluctuation due to the change in ambient temperature is minimized, and thus high frequency accuracy is realized.

As an example of such a TCXO, JP-A-2007-67967 discloses a TCXO using a semiconductor substrate provided with an oscillation circuit, an output buffer circuit, and a temperature sensor circuit, in which the output buffer circuit and the temperature sensor circuit are disposed in diagonal corners or the same side corners of the semiconductor substrate.

In JP-A-2007-67967, if the output buffer circuit which is one of heat generation sources is close to the temperature sensor circuit, a temperature of the output buffer circuit is easily transferred to the temperature sensor circuit, and thus a temperature detected by the temperature sensor circuit is higher than temperatures of regions other than the output buffer circuit. As a result, there is a possibility that a temperature may not be accurately detected. For this reason, for example, in a case where temperature compensation is performed on the basis of an output signal from the temperature sensor circuit when the TCXO is activated, an influence of a temperature in the vicinity of the output buffer circuit may be strongly received, and thus an output frequency may fluctuate.

SUMMARY

An advantage of some aspects of the invention is to provide a semiconductor circuit device, an oscillator, an electronic apparatus, and a moving object, capable of reducing frequency fluctuation.

The invention can be implemented as the following forms or application examples.

APPLICATION EXAMPLE 1

A semiconductor circuit device according to this application example includes an oscillation circuit that is connected to a resonator and causes the resonator to oscillate; an output circuit that receives a signal output from the oscillation circuit and outputs an oscillation signal; a temperature sensing element; a characteristic adjustment circuit that adjusts characteristics of the oscillation circuit on the basis of a signal output from the temperature sensing element; a first connection terminal that is electrically connected to the output circuit and via which the oscillation signal is output; and a semiconductor substrate on which the circuits, the temperature sensing element, and the first connection terminal are provided, in which a distance between the output circuit and the first connection terminal is shorter than a distance between the temperature sensing element and the first connection terminal in a plan view.

The characteristic adjustment circuit may be, for example, a temperature compensation circuit, a frequency adjustment circuit, or an automatic frequency control (AFC) circuit.

The oscillation circuit may be a part of each of various oscillation circuits such as a Pierce oscillation circuit, an inverter type oscillation circuit, a Colpitts oscillation circuit, and a Hartley oscillation circuit.

According to this application example, heat generated from the output circuit which is one of heat generation sources is dissipated via the first connection terminal, and thus a temperature increase of the semiconductor circuit device is reduced. A thermal influence on the temperature sensing element is reduced. Therefore, since the oscillation circuit is unlikely to be influenced by heat generated from the output circuit, and the temperature sensing element can accurately detect a temperature of the oscillation circuit, it is possible to implement the semiconductor circuit device which can reduce frequency fluctuation during activation, for example, when an oscillator is configured.

APPLICATION EXAMPLE 2

The semiconductor circuit device may further include a second connection terminal via which power for operating the output circuit is supplied to the output circuit; and a first wiring via which the output circuit is electrically connected to the second connection terminal, and the first wiring and the temperature sensing element may not overlap each other in a plan view.

If the first wiring and the temperature sensing element overlap each other in a plan view, heat generated from the output circuit tends to be transferred to the temperature sensing element via the first wiring. According to this application example, since the first wiring and the temperature sensing element do not overlap each other in a plan view, the temperature sensing element is unlikely to be influenced by heat generated from the output circuit. Therefore, since the temperature sensing element can accurately detect a temperature of the oscillation circuit, it is possible to implement the semiconductor circuit device which can reduce frequency fluctuation during activation, for example, when an oscillator is configured.

APPLICATION EXAMPLE 3

The semiconductor circuit device may further include a second wiring that intersects a virtual straight line connecting the output circuit and the temperature sensing element to each other in a plan view, and the second wiring may be electrically connected to the first connection terminal.

According to this application example, heat generated from the output circuit is dissipated to the first connection terminal via the second wiring. Consequently, the temperature sensing element is unlikely to be influenced by the heat generated from the output circuit. Therefore, since the temperature sensing element can accurately detect a temperature of the oscillation circuit, it is possible to implement the semiconductor circuit device which can reduce frequency fluctuation during activation, for example, when an oscillator is configured.

APPLICATION EXAMPLE 4

The semiconductor circuit device may further include a second wiring that intersects a virtual straight line connecting the output circuit and the temperature sensing element to each other in a plan view, and the second wiring may be electrically connected to the second connection terminal.

According to this application example, heat generated from the output circuit is dissipated to the second connection terminal via the second wiring. Consequently, the temperature sensing element is unlikely to be influenced by the heat generated from the output circuit. Therefore, since the temperature sensing element can accurately detect a temperature of the oscillation circuit, it is possible to implement the semiconductor circuit device which can reduce frequency fluctuation during activation, for example, when an oscillator is configured.

APPLICATION EXAMPLE 5

The semiconductor circuit device may further include a memory that stores data for controlling at least one of the oscillation circuit, the output circuit, and the characteristic adjustment circuit.

According to this application example, it is possible to implement the semiconductor circuit device which can easily control at least one of the oscillation circuit, the output circuit, and the characteristic adjustment circuit.

APPLICATION EXAMPLE 6

In the semiconductor circuit device, the characteristic adjustment circuit may be a temperature compensation circuit.

According to this application example, the temperature sensing element can accurately detect a temperature of the oscillation circuit, and thus it is possible to implement the semiconductor circuit device which can perform frequency-temperature compensation with high accuracy.

APPLICATION EXAMPLE 7

In the semiconductor circuit device, the output circuit may include a frequency division circuit.

According to this application example, it is possible to implement the semiconductor circuit device which can reduce frequency fluctuation during activation and can selectively output a plurality of frequencies.

APPLICATION EXAMPLE 8

An oscillator according to this application example includes any one of the semiconductor circuit devices; the resonator, and a container that accommodates the semiconductor circuit device and the resonator.

According to this application example, since the oscillation circuit is unlikely to be influenced by heat generated from the output circuit, and the temperature sensing element can accurately detect a temperature of the oscillation circuit, it is possible to implement the oscillator which can reduce frequency fluctuation during activation, for example.

APPLICATION EXAMPLE 9

An electronic apparatus according to this application example includes any one of the semiconductor circuit devices.

APPLICATION EXAMPLE 10

A moving object according to this application example includes anyone of the semiconductor circuit devices.

According to these application examples, since the semiconductor circuit device which can reduce frequency fluctuation during activation is used when an oscillator is configured, it is possible to implement the electronic apparatus and the moving object with high reliability.

BRIEF DESCRIPTION OF THE DRAWINGS

The invention will be described with reference to the accompanying drawings, wherein like numbers reference like elements.

FIG. 5 is a diagram illustrating an example of a relationship between a set value of an output level adjustment register, an output voltage from a D/A converter, and a clip voltage.

FIGS. 6A and 6B are diagrams illustrating examples of an output waveform of a clipped sine wave.

DESCRIPTION OF EXEMPLARY EMBODIMENTS

Hereinafter, a preferred embodiment of the invention will be described in detail with reference to the drawings. The drawings are used for convenience of description. The embodiment described below is not intended to improperly limit the content of the invention disclosed in the appended claims. It cannot be said that all constituent elements described below are essential constituent elements of the invention.

1. Semiconductor Circuit Device 1-1. Circuit Configuration

Figure 1:
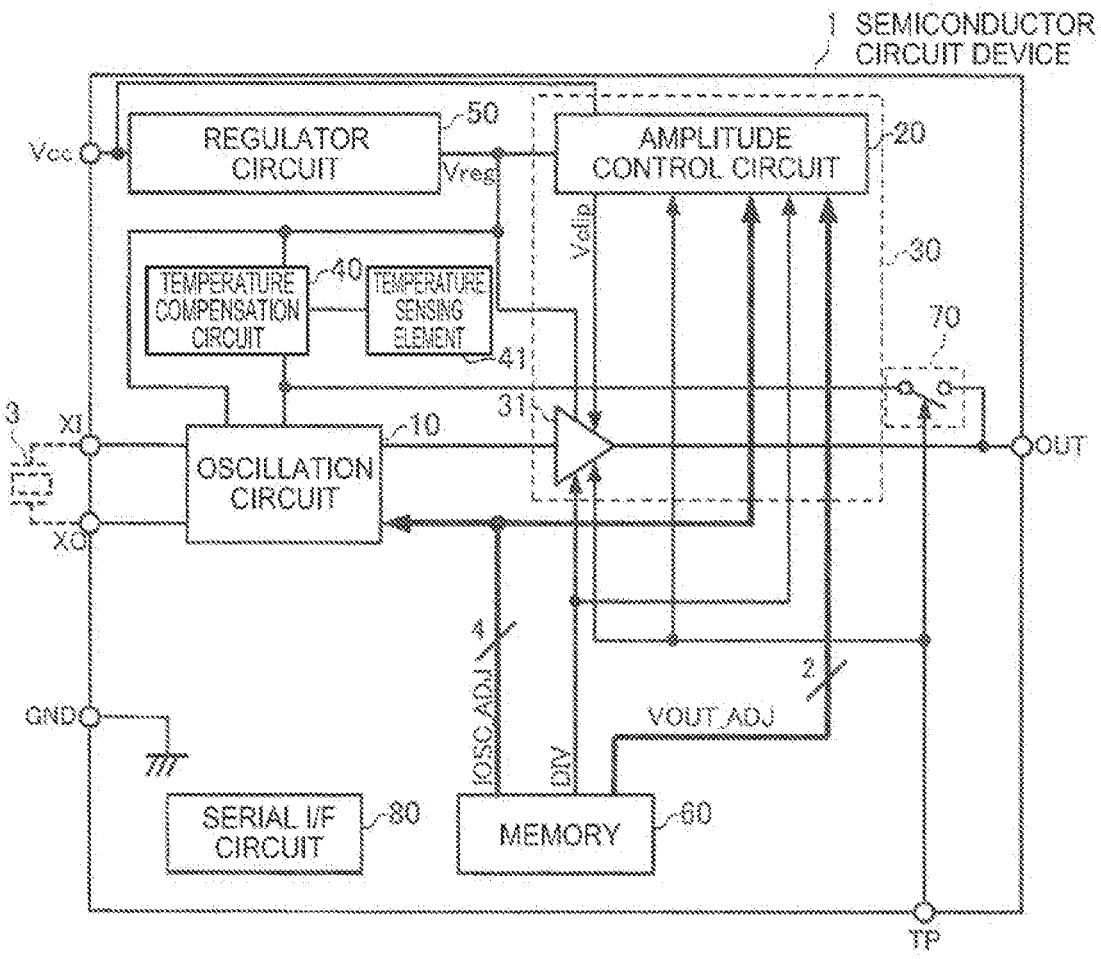
FIG. 1 is a circuit diagram of a semiconductor circuit device according to the present embodiment.

FIG. 1 is a circuit diagram of a semiconductor circuit device 1 according to the present embodiment. As illustrated in FIG. 1, the semiconductor circuit device 1 according to the present embodiment is connected to a resonator 3 so as to constitute a temperature compensated oscillator.

In the present embodiment, the resonator 3 is a quartz crystal resonator in which quartz crystal is used as a substrate material, and employs, for example, an AT cut or SC cut quartz crystal resonator or a tuning fork type quartz crystal resonator. The resonator 3 may be a surface acoustic wave (SAW) resonator or a micro electromechanical system (MEMS) resonator. As substrate materials of the resonator 3, not only quartz crystal but also piezoelectric materials including piezoelectric single crystals such as Lithium Tantalate or Lithium Niobate, or piezoelectric ceramics such as Zirconate Titanate, or silicon semiconductor materials may be used. As a method of exciting the resonator 3, a method using a piezoelectric effect may be used, or electrostatic driving using a Coulomb force may be used. The resonator 3 of the present embodiment is a chip-like element obtained by dividing a substrate material into individual pieces but is not limited thereto, and a resonance device may be used in which a chip-like element is enclosed in a container.

The semiconductor circuit device 1 is provided with a Vcc terminal which is a power supply terminal, a GND terminal which is a ground terminal, an OUT terminal which is an output terminal, a TP terminal which is a test terminal or to which a signal for controlling the semiconductor circuit device 1 is input, and an XI terminal and an XO terminal which are terminals connected to the resonator 3. The Vcc terminal, the GND terminal, the OUT terminal, and the TP terminal are also connected to external terminals (not illustrated) of the oscillator.

In the present embodiment, the semiconductor circuit device 1 is configured to include an oscillation circuit 10, an output circuit 30, a temperature compensation circuit 40 (an example of a "characteristic adjustment circuit"), a temperature sensing element 41, a regulator circuit 50, a memory 60, a switch circuit 70 (an example of a "switching unit"), and a serial interface (I/F) circuit 80. The semiconductor circuit device 1 of the present embodiment may have a configuration in which some of the above-described constituent elements are omitted or changed, or other constituent elements are added thereto.

The oscillation circuit 10, which is connected to the resonator 3 and causes the resonator 3 to oscillate, amplifies an output signal from the resonator 3 and feeds the amplified signal back to the resonator 3. The oscillation circuit 10 outputs an oscillation signal based on oscillation of the resonator 3.

The temperature compensation circuit 40 generates a temperature compensation voltage corresponding to frequency-temperature characteristics of the resonator 3 with a temperature as a variable so that an oscillation frequency of the oscillation circuit 10 is constant regardless of a temperature, on the basis of a signal output from the temperature sensing element 41. The temperature compensation voltage is applied to one end of a variable capacitance element (not illustrated) which functions as a load capacitor of the oscillation circuit 10, and thus the oscillation frequency is controlled.

A signal generation circuit 31 of the output circuit 30 receives an oscillation signal from the oscillation circuit 10, and generates an oscillation signal for being output to an external device and outputs the signal.

An amplitude control circuit 20 of the output circuit 30 controls the amplitude of the oscillation signal output from the signal generation circuit 31. The amplitude control circuit 20 includes an amplitude control unit which controls the amplitude of the oscillation signal output from the signal generation circuit 31, and a heat generation unit. As will be described later, the heat generation unit controls an input DC current on the basis of operation states of the oscillation circuit 10 and the amplitude control unit of the amplitude control circuit 20.

The regulator circuit 50 generates a predetermined output voltage Vreg which serves as a power supply voltage or a reference voltage of the oscillation circuit 10, the temperature compensation circuit 40, and the output circuit 30, on the basis of a power supply voltage supplied via the Vcc terminal.

The memory 60 includes a nonvolatile memory and a register (not illustrated), and allows data to be read from or written to the nonvolatile memory or the register from an external terminal via the serial interface circuit 80. In the present embodiment, since only four terminals such as the Vcc terminal, the GND terminal, the OUT terminal, and the TP terminal as terminals of the semiconductor circuit device 1 are connected to external terminals when the oscillator is configured, the serial interface circuit 80 may receive a clock signal SCLK which is externally input from the TP terminal and a data signal DATA which is externally input from the OUT terminal, for example, when a voltage of the Vcc terminal is higher than a threshold value, and thus data may be read from or written to the nonvolatile memory or the internal register (not illustrated). The memory 60 may store data for controlling at least one of the oscillation circuit 10, the output circuit 30, and the characteristic adjustment circuit (temperature compensation circuit 40). Consequently, it is possible to implement the semiconductor circuit device 1 which can easily control at least one of the oscillation circuit 10, the output circuit 30, and the characteristic adjustment circuit (temperature compensation circuit 40).

The switch circuit 70 is a circuit for switching electrical connection between the temperature compensation circuit 40 and the OUT terminal (an example of a first terminal) which is connected to an output side of the output circuit 30.

In the present embodiment, when a signal input to the TP terminal has a low level (an example of a first mode), the switch circuit 70 is controlled so that electrical connection does not occur between the temperature compensation circuit 40 and the OUT terminal, and thus an oscillation signal output from the output circuit 30 is output to the OUT terminal. As will be described later, when a signal input to the TP terminal has a low level, an operation of the heat generation unit of the amplitude control circuit 20 is stopped.

On the other hand, when a signal input to the TP terminal has a high level (an example of a second mode), the switch circuit 70 is controlled so that electrical connection occurs between the temperature compensation circuit 40 and the OUT terminal and thus the output circuit 30 stops outputting the oscillation signal, and, as a result, an output signal (temperature compensation voltage) from the temperature compensation circuit 40 is output to the OUT terminal. As will be described later, when a signal input to the TP terminal has a high level, the heat generation unit of the amplitude control circuit 20 controls an input DC current on the basis of operation states of the oscillation circuit 10 and the amplitude control unit of the amplitude control circuit 20.

In a case where the temperature compensated oscillator is used as a TCXO for GPS which is used in cellular communication or the like, for example, frequency-temperature compensation accuracy such as ±0.5 ppm is required. Therefore, in the present embodiment, the output voltage amplitude of the output circuit 30 is stabilized by the regulator circuit 50, and the output circuit 30 outputs a clipped sine wave in which the output amplitude is minimized from the viewpoint of reducing current consumption. In the present embodiment, the output amplitude of the output circuit 30 can be adjusted in a range of, for example, 0.8 Vpp to 1.2 Vpp by the amplitude control circuit 20, and a heat generation circuit which is smaller in size than in the related art is built into the amplitude control circuit 20. In the present embodiment, the memory 60 is provided with an oscillation stage current adjustment register IOSC_ADJ (data for controlling the oscillation circuit 10) for adjusting and selecting an oscillation stage current of the oscillation circuit 10 on the basis of a frequency of the resonator 3; a frequency division switching register DIV (data for controlling the output circuit 30) for selecting whether or not an oscillation signal is frequency-divided and is output by a frequency division circuit provided in the output circuit 30; and an output level adjustment register VOUT_ADJ (data for controlling the amplitude control circuit 20) for adjusting an amplitude level of an oscillation signal with a clipped sine wave, output from the output circuit 30. Thus, an amount of current which flows through the heat generation circuit in the amplitude control circuit 20 is controlled in conjunction with set states based on the data stored in the registers.

The set values of the registers are stored in the nonvolatile memory of the memory 60, for example, when the semiconductor circuit device 1 is manufactured, and the set values are written to the respective registers from the nonvolatile memory when power is supplied after an oscillator is assembled. For example, when the semiconductor circuit device 1 is manufactured, the nonvolatile memory also stores temperature compensation data (respective coefficient values (which may include respective coefficient values of fourth-order or fifth-order) of zero-order, first-order, and third-order in accordance with the frequency-temperature characteristics of the resonator 3, or a correspondence table between the temperature and the temperature compensation voltage) (data for controlling the temperature compensation circuit 40) which is input to the temperature compensation circuit 40.

Configuration of Oscillation Circuit

Figure 2:
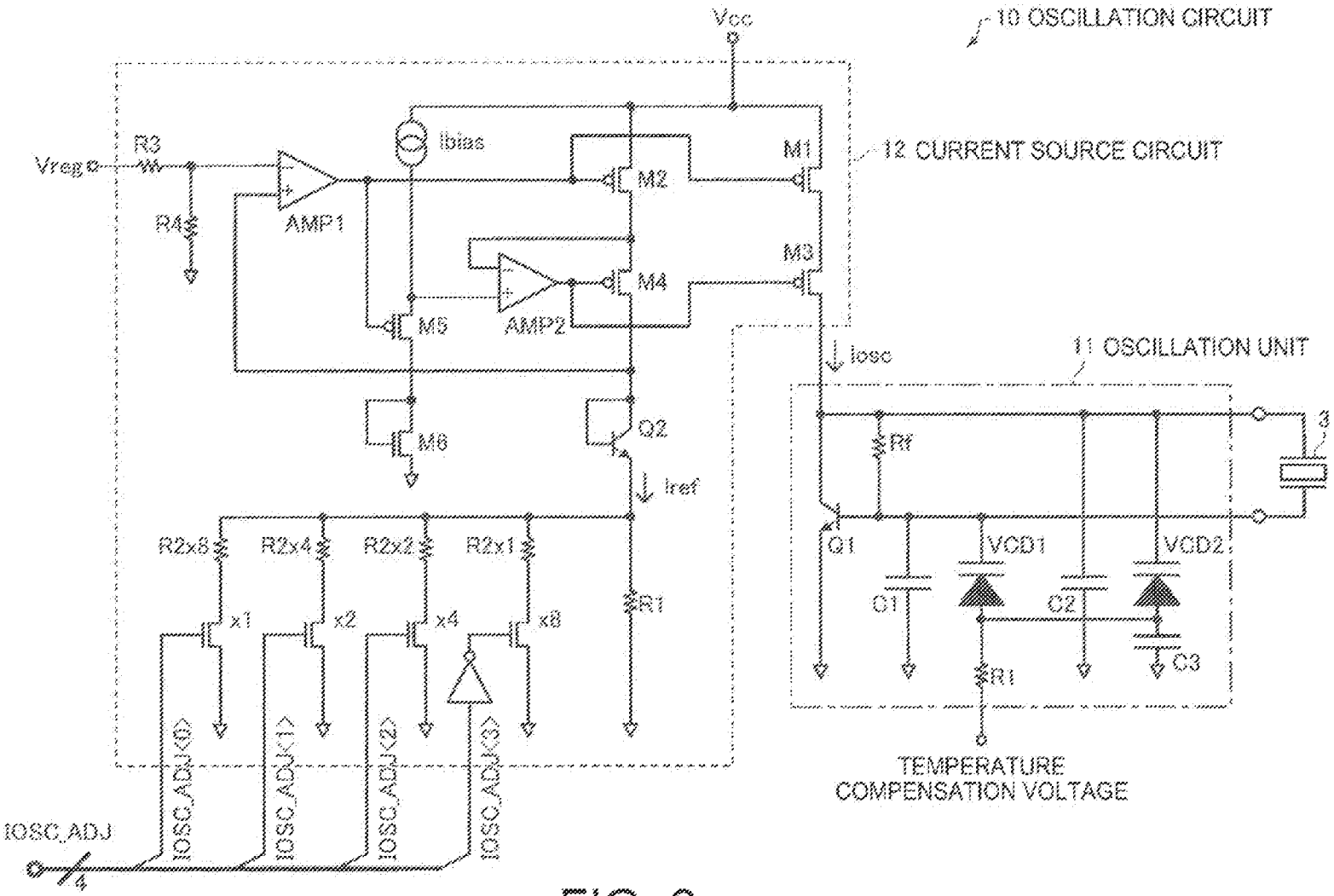
FIG. 2 is a circuit diagram of an oscillation circuit.

FIG. 2 is a circuit diagram of the oscillation circuit 10 illustrated in FIG. 1. As illustrated in FIG. 2, the oscillation circuit 10 includes an oscillation unit 11 and a current source circuit 12. The oscillation unit 11 is connected to the resonator 3 so as to constitute a Pierce type oscillation circuit. In the oscillation unit 11, varicap diodes VCD1 and VCD2 which are variable capacitance elements and are connected in series to each other are connected in parallel to the resonator 3. A temperature compensation voltage is applied to the varicap diodes VCD1 and VCD2 so that a capacitance value of the oscillation unit 11 changes with respect to the temperature, and thus an oscillation signal for compensating for the frequency-temperature characteristics of the resonator 3 is output.

The current source circuit 12 generates a current Iref which is used as a reference of an oscillation stage current Iosc by using a differential amplifier AMP1, a PMOS transistor M2, a bipolar transistor Q2, and a current adjustment unit in which a resistor R1 and a plurality of resistors R2 are connected in parallel to each other. The current Iref is adjusted by a set value of 4-bit IOSC_ADJ. A size of a gate width of a PMOS transistor M1 and a size of a gate width of the PMOS transistor M2 have a ratio of 10:1, for example. A size of a gate width of a PMOS transistor M3 and a size of a gate width of the PMOS transistor M4 also have the same size ratio. For example, if Iref=20 μA, 200 μA which is ten times thereof is supplied to the oscillation unit 11 as an oscillation stage current. A circuit constituted of a differential amplifier AMP2, the PMOS transistor M4, a current source which causes a bias current Ibias to flow, and PMOS transistors M5 and M6 further minimizes power supply dependency of the oscillation stage current Iosc which flows through the cascade-connected PMOS transistors M1 and M3. The circuit is a gain enhancement cascade circuit which reduces power supply dependency of a current output from the current source more than a cascade circuit, in the TCXO which requires high frequency accuracy. In the cascade circuit, a source voltage of the PMOS transistor M4 on the reference side is monitored, gate voltages of the PMOS transistors M3 and M4 are controlled by the differential amplifier AMP2 when a power supply voltage (a voltage of the Vcc terminal) fluctuates, and changes in potential differences between sources and drains of the PMOS transistors M1 and M2 are further minimized. An output resistance value of the current source circuit 12 further increases by multiples of a gain of the differential amplifier AMP2. The oscillation stage current Iosc is stabilized with respect to the fluctuation in the power supply voltage, and thus the fluctuation in an oscillation frequency of the oscillation unit 11 is minimized.

Configuration of Output Circuit

Figure 3:
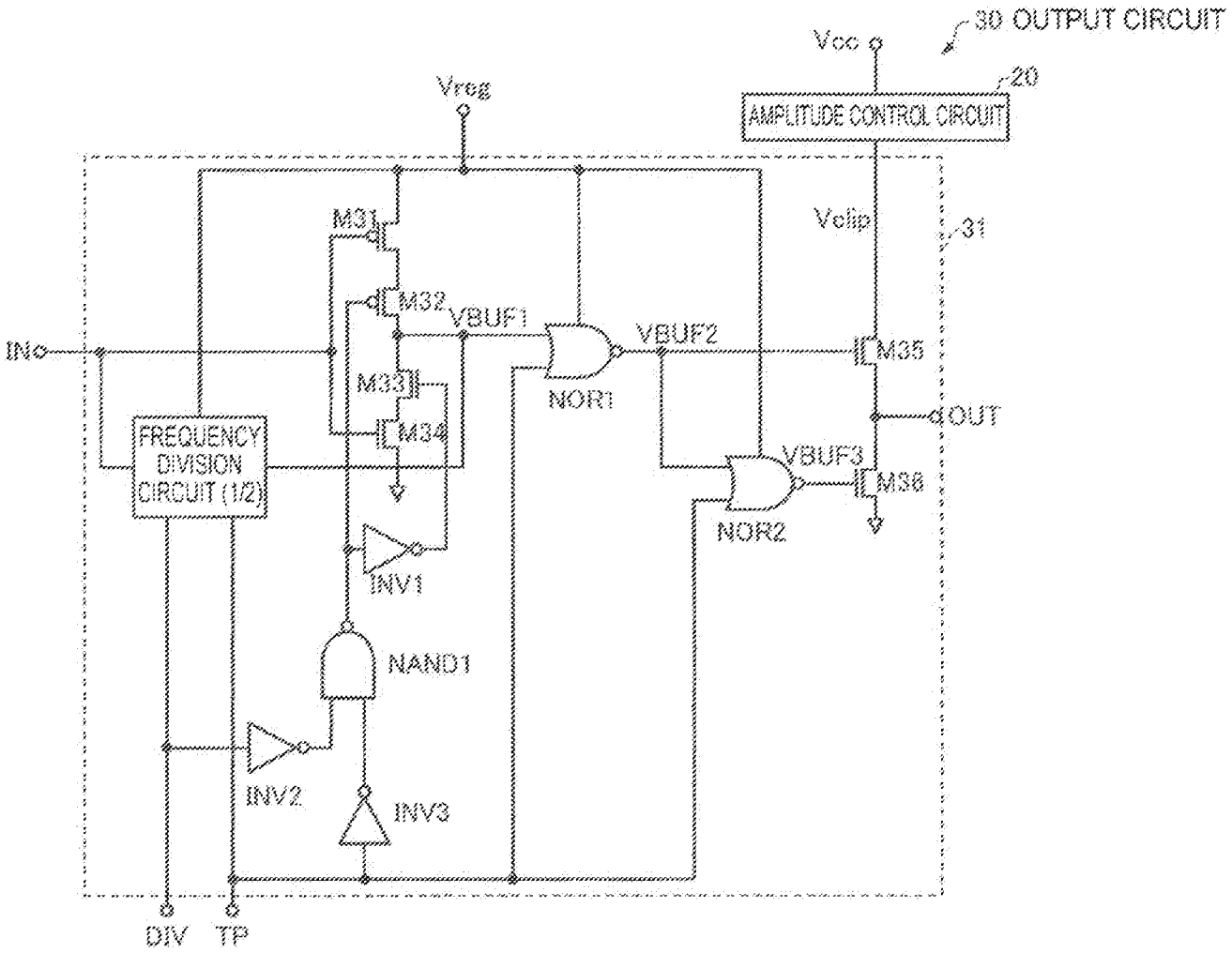
FIG. 3 is a circuit diagram of an output circuit.

FIG. 3 is a circuit diagram of the output circuit 30 illustrated in FIG. 1. As illustrated in FIG. 3, in the output circuit 30, an output voltage Vreg from the regulator circuit 50 is applied to a Vreg terminal, and a clip voltage Vclip for obtaining a clipped sine wave output signal generated by the amplitude control circuit 20 is applied to a Vclip terminal. The output circuit 30 includes a frequency division circuit, and can select whether or not a frequency of a signal (an oscillation signal output from the oscillation circuit 10) which is input to an IN terminal is divided by 2 on the basis of a voltage level of a DIV terminal. In the present embodiment, when a set value of the frequency division switching register DIV is 0, the DIV terminal is set to a low level, and thus a frequency of an input signal is not divided. In addition, a polarity of the input signal is inverted by an inverter constituted of MOS transistors M31 to M34, and a signal of a node VBUF1 is delivered to a NOR circuit NOR1. On the other hand, when a set value of the frequency division switching register DIV is 1, the DIV terminal is set to a high level, and thus a frequency of an input signal is divided by 2. In addition, a signal of the node VBUF1 is delivered to the NOR circuit NOR1.

The output circuit 30 is in an operable state when the TP terminal is set to a low level, and is in a non-operation state when the TP terminal is set to a high level. During normal operation, the TP terminal is set to a low level, and an input signal from an IN terminal is clipped to a voltage amplitude level defined by the clip voltage Vclip and is output from the OUT terminal. When the temperature compensation circuit 40 illustrated in FIG. 1 is adjusted (tested), the TP terminal is set to a high level. In addition, the MOS transistors M32 and M33 are turned off, and thus both an output node VBUF2 of the NOR circuit NOR1 and an output node VBUF3 of a NOR circuit NOR2 have a ground potential so that NMOS transistors M35 and M36 are turned off. Consequently, the output circuit 30 is brought into a non-operation state.

Since a larger current flows through the NMOS transistors M35 and M36 than other transistors, the NMOS transistors M35 and M36 may be main heat generation sources of the output circuit 30.

Configuration of Amplitude Control Circuit

Figure 4:
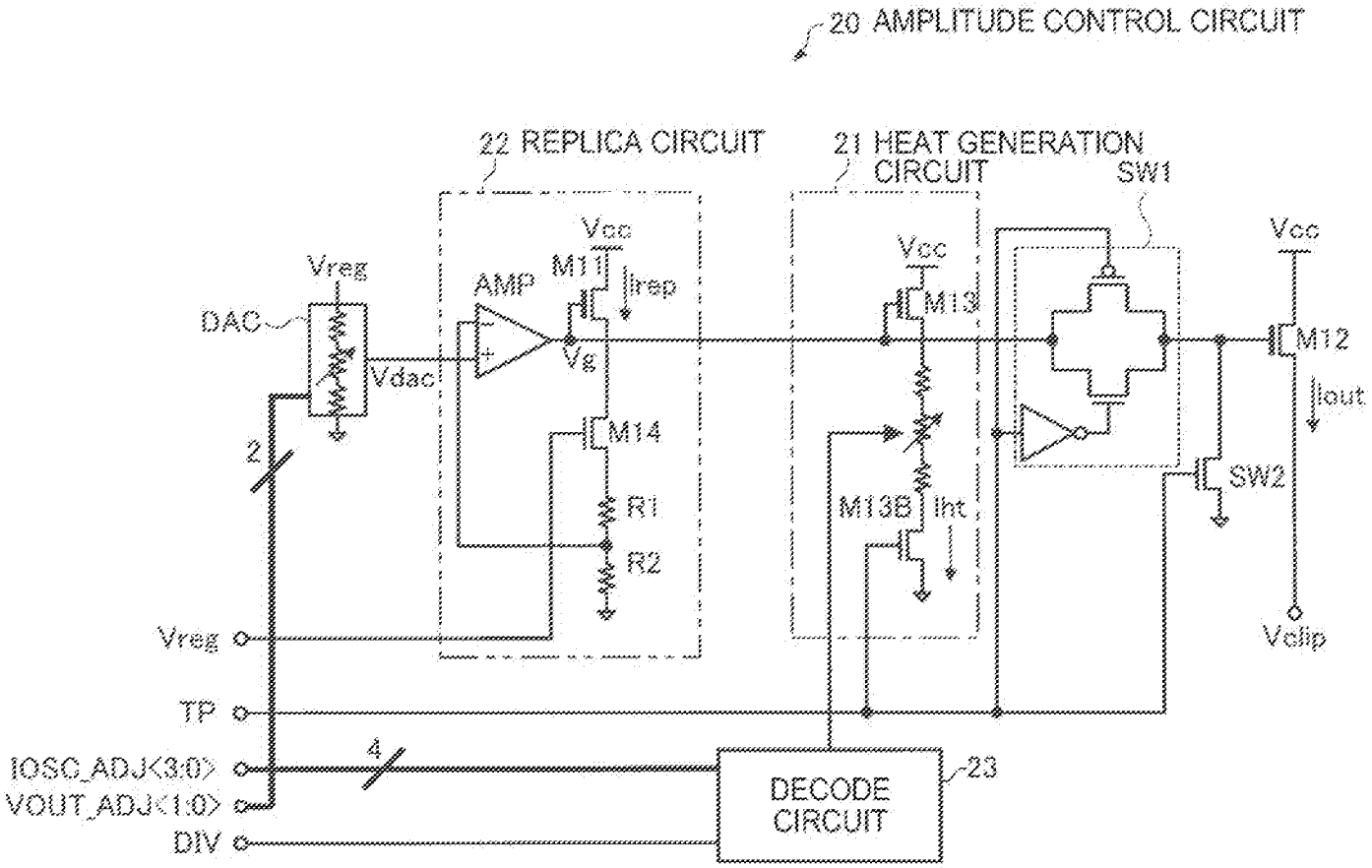
FIG. 4 is a circuit diagram of an amplitude control circuit.

FIG. 4 is a circuit diagram of the amplitude control circuit 20 illustrated in FIG. 1. In FIG. 4, NMOS transistors M11, M12 and M13 are depletion type MOS transistors, and other MOS transistors are normal type (enhancement type) MOS transistors. The amplitude control circuit 20 illustrated in FIG. 4 causes a static current (DC current) Iht to flow during adjustment of the temperature compensation circuit 40, so as to generate heat corresponding to heat which is generated from the output circuit 30 during normal operation. Consequently, fluctuation in an amount of generated heat between a normal operation and adjustment of the temperature compensation circuit 40 is minimized.

As shown in the following Equation (1), the clip voltage Vclip for defining an output amplitude level of the output circuit 30 is a voltage obtained by subtracting a gate-source voltage $Vgs_{M12}$ of the NMOS transistor M12 from an output voltage Vg from a differential amplifier AMP.

$$Vclip = Vg - Vgs_{M12} \tag{1}$$

The voltage Vg is obtained from an analog output voltage Vdac having undergone D/A conversion in a D/A converter DAC on the basis of data given by the output level adjustment register VOUT_ADJ according to the following Equation (2).

$$Vg = Vdac \cdot \left(\frac{R1}{R2} + 1\right) + Vgs_{M11} \tag{2}$$

A relationship of the following Equation (3) is established by assigning Equation (2) to Equation (1). In other words, the clip voltage Vclip is defined by the voltage Vdac·(R1/R2+1) obtained by amplifying the output voltage Vdac from the D/A converter DAC with the differential amplifier AMP.

$$Vclip + Vgs_{M12} = Vdac \cdot \left(\frac{R1}{R2} + 1\right) + Vgs_{M11} \tag{3}$$

During normal operation, the TP terminal is set to a low level, and thus a switch circuit SW1 is turned on, an NMOS switch SW2 is turned off, and a MOS transistor M13B is turned off, so that a heat generation circuit 21 is brought into a non-operation state. On the other hand, during adjustment of the temperature compensation circuit 40, the TP terminal is set to a high level, and thus the switch circuit SW1 is turned off, and the NMOS switch SW2 is turned on. Therefore, the NMOS transistor M12 is turned off, and thus the heat generation circuit 21 including the NMOS transistor M13 is brought into an operation state.

A waveform of a signal output from the output circuit 30 is a waveform corresponding to a clipped sine wave as illustrated in FIGS. 6A and 6B. Since a peak value (amplitude) of the clipped sine wave is reduced as an output frequency becomes higher, a set value of the output level adjustment register VOUT_ADJ is selected in accordance with the output frequency. Generally, a set value of the output level adjustment register VOUT_ADJ is selected so that 0.8 Vpp or more is secured as the amplitude of the clipped sine wave. FIG. 5 illustrates a relationship between a set value of the output level adjustment register VOUT_ADJ, the output voltage Vdac from the D/A converter DAC, and the clip voltage Vclip. FIG. 5 illustrates an example of a case where a gain of a replica circuit 22 including the differential amplifier AMP is set to about 1.2 times, and the clip voltage Vclip exhibits a DC voltage value. FIGS. 6A and 6B are diagrams illustrating examples of output waveforms corresponding to clipped sine waves in cases where output frequencies are 26 MHz and 52 MHz, and the output level adjustment register VOUT_ADJ is set to "01" in both cases. As illustrated in FIG. 5, in a case where the output level adjustment register VOUT_ADJ is set to "01", the clip voltage Vclip becomes 0.9 V. In addition, as illustrated in FIG. 6A, in a case where an output frequency is 26 MHz, the amplitude of the clipped sine wave is about 0.9 Vpp, and, as illustrated in FIG. 6B, about 0.82 Vpp is secured as the amplitude of the clipped sine wave even in a case where an output frequency is 52 MHz. Since there is a case where the amplitude of the clipped sine wave is slightly reduced at an output frequency of 52 MHz, the output level adjustment register VOUT_ADJ may be set to "10" so that the amplitude becomes 0.92 Vpp by increasing the amplitude by 0.1 Vpp.

Figure 7:
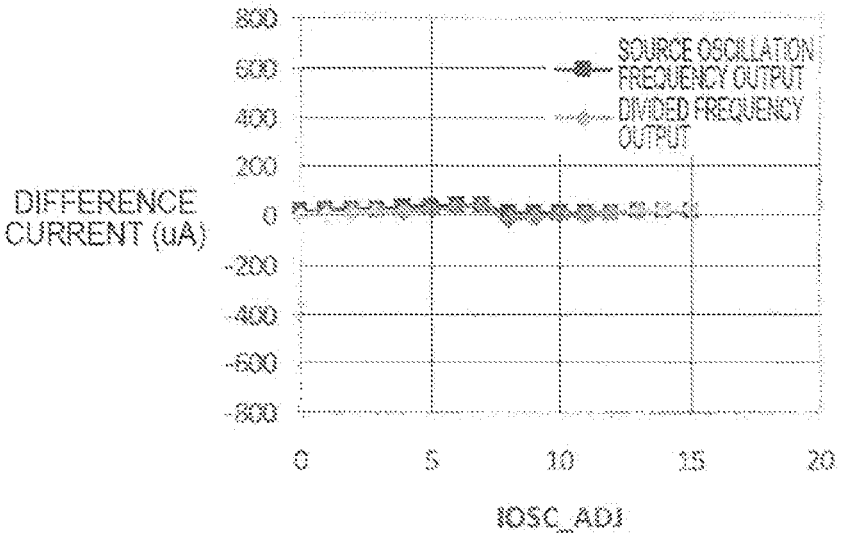
FIG. 7 is a diagram illustrating a relationship between a set value of an oscillation stage current adjustment register and a difference current.

In the present embodiment, when the TP terminal is set to a high level, the current Iht which flows through the heat generation circuit 21 is changed in conjunction with a set value of the oscillation stage current adjustment register IOSC_ADJ, a set value of the frequency division switching register DIV, and a set value of the output level adjustment register VOUT_ADJ. When the TP terminal is set to a low level, the current Iht becomes a current corresponding to a current which is consumed in the output circuit 30. Consequently, it is possible to reduce a difference current which is a current corresponding to a difference between current consumption of the oscillator using the semiconductor circuit device 1 when the TP terminal is set to a low level and current consumption of the oscillator using the semiconductor circuit device 1 when the TP terminal is set to a high level. In other words, fluctuation in an amount of heat generated from the oscillation circuit 10 is minimized by reducing a difference between a current when the output circuit 30 is in an operation state and a current when the output circuit 30 is in a non-operation state. As an example, FIG. 7 illustrates a relationship between a set value of the oscillation stage current adjustment register IOSC_ADJ and a difference current. FIG. 7 illustrates the relationship when a set value of the frequency division switching register DIV is 0 (when a source oscillation frequency is output) and 1 (when a divided frequency is output). As illustrated in FIG. 7, in the oscillator using the semiconductor circuit device 1 of the present embodiment, it is possible to reduce a difference between currents when the output circuit 30 is in an operation state and a non-operation state and thus to successfully cause a difference current to be close to 0, even in a case where a value of the oscillation stage current adjustment register IOSC_ADJ or the frequency division switching register DIV is separately set depending on division of an oscillation frequency or an output frequency.

The heat generation circuit 21 functions as a heat generation unit, and the other circuits other than the heat generation circuit 21 in the amplitude control circuit 20 function as an amplitude control unit.

1-2. Layout Configuration 1-2-1. First Specific Example

Figure 8:
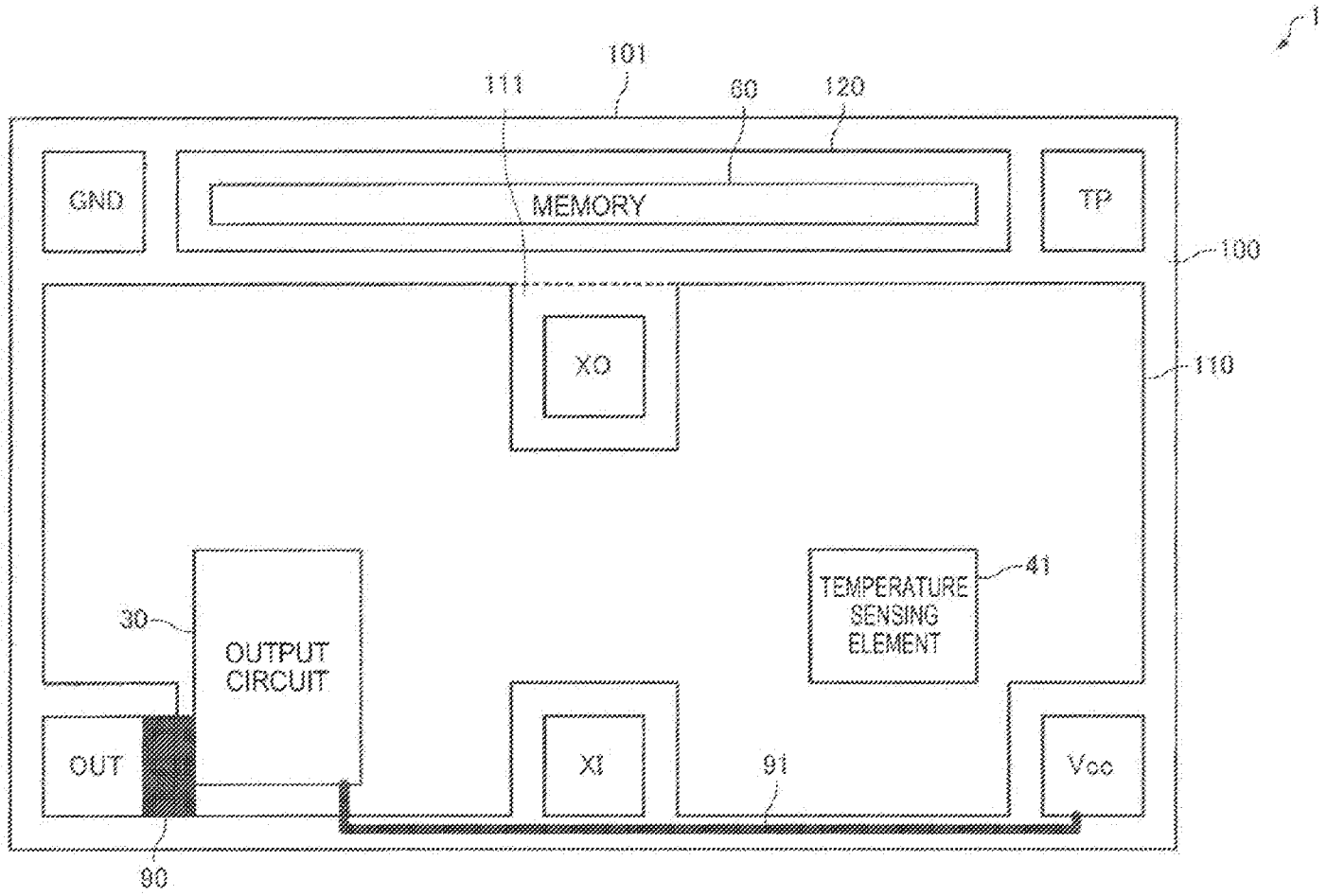
FIG. 8 is a plan view schematically illustrating a layout configuration of the semiconductor circuit device related to a first specific example.

FIG. 8 is a plan view schematically illustrating a layout configuration of the semiconductor circuit device 1 related to a first specific example. In FIG. 8, some of the circuits included in the semiconductor circuit device 1 are not illustrated.

The semiconductor circuit device 1 related to the present specific example is configured to include a semiconductor substrate 100; a first circuit block 110 which includes at least the output circuit 30 and the temperature sensing element 41 disposed on the semiconductor substrate 100 as constituent elements; and a second circuit block 120 which includes at least the memory 60 disposed on the semiconductor substrate 100 as a constituent element. The semiconductor circuit device 1 according to the present embodiment is configured to include a connection terminal XI, a connection terminal XO, a connection terminal Vcc (second connection terminal), a connection terminal GND (third connection terminal), a connection terminal OUT (first connection terminal), and a connection terminal TP which respectively correspond to the terminals illustrated in FIG. 1. The semiconductor circuit device 1 is configured to include a wiring 90 via which the output circuit 30 is electrically connected to the connection terminal OUT (first connection terminal) and a first wiring 91 via which power for operating the output circuit 30 is supplied to the output circuit 30.

The connection terminal OUT (first connection terminal) is a terminal via which an oscillation signal from the output circuit 30 is output. In the present specific example, the wiring 90 is thicker than other wirings in order to reduce thermal resistance. Since a large current flows through the first wiring 91, the first wiring 91 is generally thicker than other wirings (excluding the wiring 90).

As illustrated in FIG. 8, in the present specific example, a distance (shortest straight distance) between the output circuit 30 and the connection terminal OUT (first connection terminal) is shorter than a distance (shortest straight distance) between the temperature sensing element 41 and the connection terminal OUT (first connection terminal) in a plan view.

According to the present specific example, heat generated from the output circuit 30 which is one of heat generation sources is dissipated via the connection terminal OUT (first connection terminal), and thus a temperature increase of the semiconductor circuit device 1 is reduced. A thermal influence on the temperature sensing element 41 is reduced. Therefore, since the oscillation circuit 10 is unlikely to be influenced by heat generated from the output circuit 30, and the temperature sensing element 41 can accurately detect a temperature of the oscillation circuit 10, it is possible to implement the semiconductor circuit device 1 which can reduce frequency fluctuation during activation, for example, when an oscillator is configured.

In the example illustrated in FIG. 8, the semiconductor circuit device 1 includes the connection terminal Vcc (second connection terminal) for supplying power for operating the output circuit 30 to the output circuit 30, and the first wiring 91 via which the output circuit 30 is electrically connected to the connection terminal Vcc (second connection terminal). The first wiring 91 and the temperature sensing element 41 do not overlap each other in a plan view.

If the first wiring 91 and the temperature sensing element 41 overlap each other in a plan view, heat generated from the output circuit 30 tends to be transferred to the temperature sensing element 41 via the first wiring 91. According to the present specific example, since the first wiring 91 and the temperature sensing element 41 do not overlap each other in a plan view, the temperature sensing element 41 is unlikely to be influenced by heat generated from the output circuit 30. Therefore, since the temperature sensing element 41 can accurately detect a temperature of the oscillation circuit 10, it is possible to implement the semiconductor circuit device 1 which can reduce frequency fluctuation during activation, for example, when an oscillator is configured. In the present specific example, although the output circuit 30 is exemplified as a circuit generating heat, the invention is not limited thereto, and the circuit generating heat may be a circuit which is connected to the first wiring 91 and which generates heat during an operation thereof, for example, the oscillation circuit 10, or an amplifying circuit which receives a signal from the oscillation circuit 10 and amplifies and outputs the signal.

The semiconductor circuit device 1 related to the present specific example has the further technical meaning even from the viewpoint different from the above-described technical meaning.

As illustrated in FIG. 8, the connection terminal XO is provided between the first circuit block 110 and the second circuit block 120 in a plan view.

According to the present specific example, the connection terminal XO is provided between the first circuit block 110 and the second circuit block 120 in a plan view, and thus a large single group of rectangular regions can be provided inside the second circuit block 120. Therefore, even in a case where a size of the semiconductor substrate 100 cannot be increased, a single rectangular region can be increased in the second circuit block 120, and thus, for example, a large region in which circuits having a single function are formed can be provided. Therefore, it is possible to implement the semiconductor circuit device 1 in which a degree of freedom of circuit arrangement is high.

In the present specific example, the semiconductor circuit device 1 includes a region 111 which is inserted into the first circuit block 110 in a direction becoming distant from the second circuit block 120 side in a plan view, and at least a part of the connection terminal XO is provided in the region 111 inserted into the first circuit block 110.

According to the present specific example, since the connection terminal XO is disposed to enter the first circuit block 110 in a plan view, an arrangement region of the second circuit block 120 can be provided to be large, and thus a larger single group of rectangular regions can be provided inside the second circuit block 120. Therefore, even in a case where a size of the semiconductor substrate 100 cannot be increased, a single rectangular region can be increased in the second circuit block 120, and thus, for example, a large region in which circuits having a single function are formed can be provided. Therefore, it is possible to implement the semiconductor circuit device 1 in which a degree of freedom of circuit arrangement is high.

In the present specific example, the second circuit block 120 is provided between an outer circumference 101 of the semiconductor substrate 100 and the first circuit block 110 and between the outer circumference 101 and the connection terminal XO. In the example illustrated in FIG. 8, the semiconductor substrate 100 has a rectangular shape in a plan view, and the outer circumference 101 corresponds to one side of the rectangular shape in a plan view. The semiconductor substrate 100 does not necessarily have a completely polygonal shape in a plan view, and may have a substantially polygonal shape whose outer circumference is uneven in a plan view. In this case, the outer circumference 101 may correspond to a portion which can be regarded as one side of the substantially polygonal shape.

According to the present specific example, a single rectangular region can be provided to be large inside the second circuit block 120 which is disposed on the outer circumference 101 side of the semiconductor substrate 100, compared with a case where the connection terminal XO is provided around the outer circumference 101 of the semiconductor substrate 100. Therefore, even in a case where a chip size of the semiconductor circuit device 1 cannot be increased, a single rectangular region can be increased in the second circuit block 120, and thus, for example, a large region in which circuits having a single function are formed can be provided. Therefore, it is possible to implement the semiconductor circuit device 1 in which a degree of freedom of circuit arrangement is high.

In the present specific example, the second circuit block 120 is configured to include the memory 60.

According to the present specific example, since the memory 60 can be disposed inside a single rectangular region of the second circuit block 120, it is possible to implement the semiconductor circuit device 1 in which a storage capacity of the memory 60 can be increased even in a case where a size of the semiconductor substrate 100 cannot be increased. Since the memory 60 can be disposed in a single rectangular region, wiring of the memory 60 is facilitated compared with a case where the memory 60 is provided in a plurality of regions. Address designation of the memory 60 is facilitated compared with a case where the memory 60 is provided in a plurality of regions.

In the present specific example, the second circuit block 120 is provided along the long side of the semiconductor substrate 100. Consequently, wirings with the memory 60 of the second circuit block 120 and various circuits included in the first circuit block 110 can be shortened compared with a case where the second circuit block 120 is provided along the short side of the semiconductor substrate 100.

1-2-2. Second Specific Example

Figure 9:
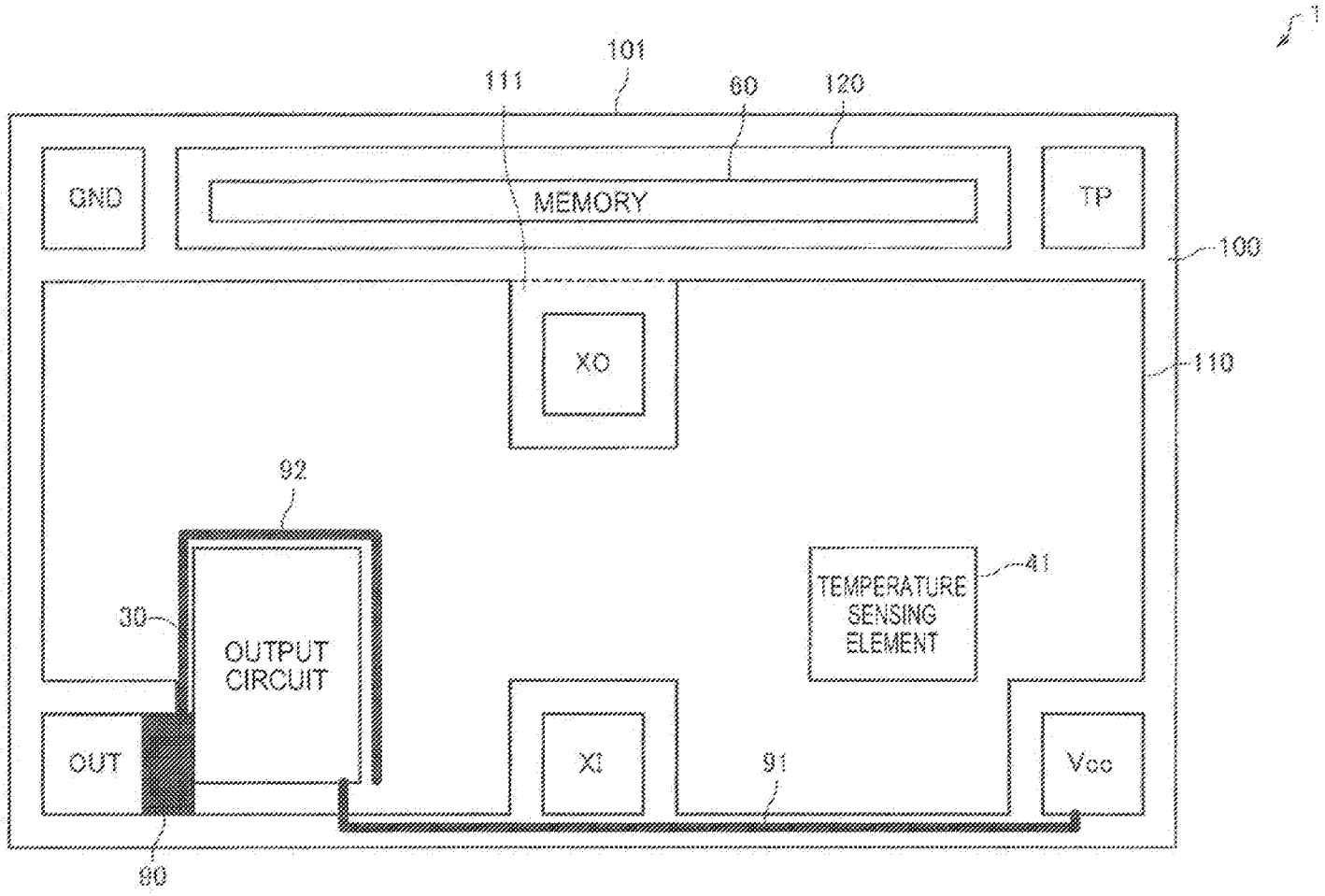
FIG. 9 is a plan view schematically illustrating a layout configuration of the semiconductor circuit device related to a second specific example.

FIG. 9 is a plan view schematically illustrating a layout configuration of the semiconductor circuit device 1 related to a second specific example. In FIG. 9, some of the circuits included in the semiconductor circuit device 1 are not illustrated. The same constituent elements as in the first specific example are given the same reference numerals, and detailed description thereof will be omitted.

As illustrated in FIG. 9, in the present specific example, the semiconductor circuit device 1 further includes a second wiring 92 which intersects a virtual straight line which connects the output circuit 30 to the temperature sensing element 41 in a plan view. The second wiring 92 is electrically connected to the connection terminal OUT (first connection terminal). The virtual straight line is a straight line which connects a virtual point inside the output circuit 30 to a virtual point inside the temperature sensing element 41, and may or may not be the shortest straight line. The virtual straight line may be a straight line which connects a diagram center (centroid) in a case where the region in which the output circuit 30 is disposed is viewed from the top to a diagram center (centroid) in a case where the region in which the temperature sensing element 41 is disposed is viewed from the top.

According to the present specific example, heat generated from the output circuit 30 is transferred to the temperature sensing element 41 along the above-described virtual straight line and is thus also transferred to the second wiring 92 intersecting the virtual straight line. Therefore, at least some of the heat generated from the output circuit is dissipated to the connection terminal OUT (first connection terminal) via the second wiring 92. Consequently, the temperature sensing element 41 is unlikely to be influenced by the heat generated from the output circuit 30. Therefore, since the temperature sensing element 41 can accurately detect a temperature of the oscillation circuit 10, it is possible to implement the semiconductor circuit device 1 which can reduce frequency fluctuation during activation, for example, when an oscillator is configured. In the present specific example, although the output circuit 30 is exemplified as a circuit generating heat, the invention is not limited thereto, and the circuit generating heat may be a circuit which generates heat during an operation thereof, for example, the oscillation circuit 10, or an amplifying circuit which receives a signal from the oscillation circuit 10 and amplifies and outputs the signal.

Also in the second specific example, the same effects can be achieved for the same reason as described in the first specific example.

1-2-3. Third Specific Example

Figure 10:
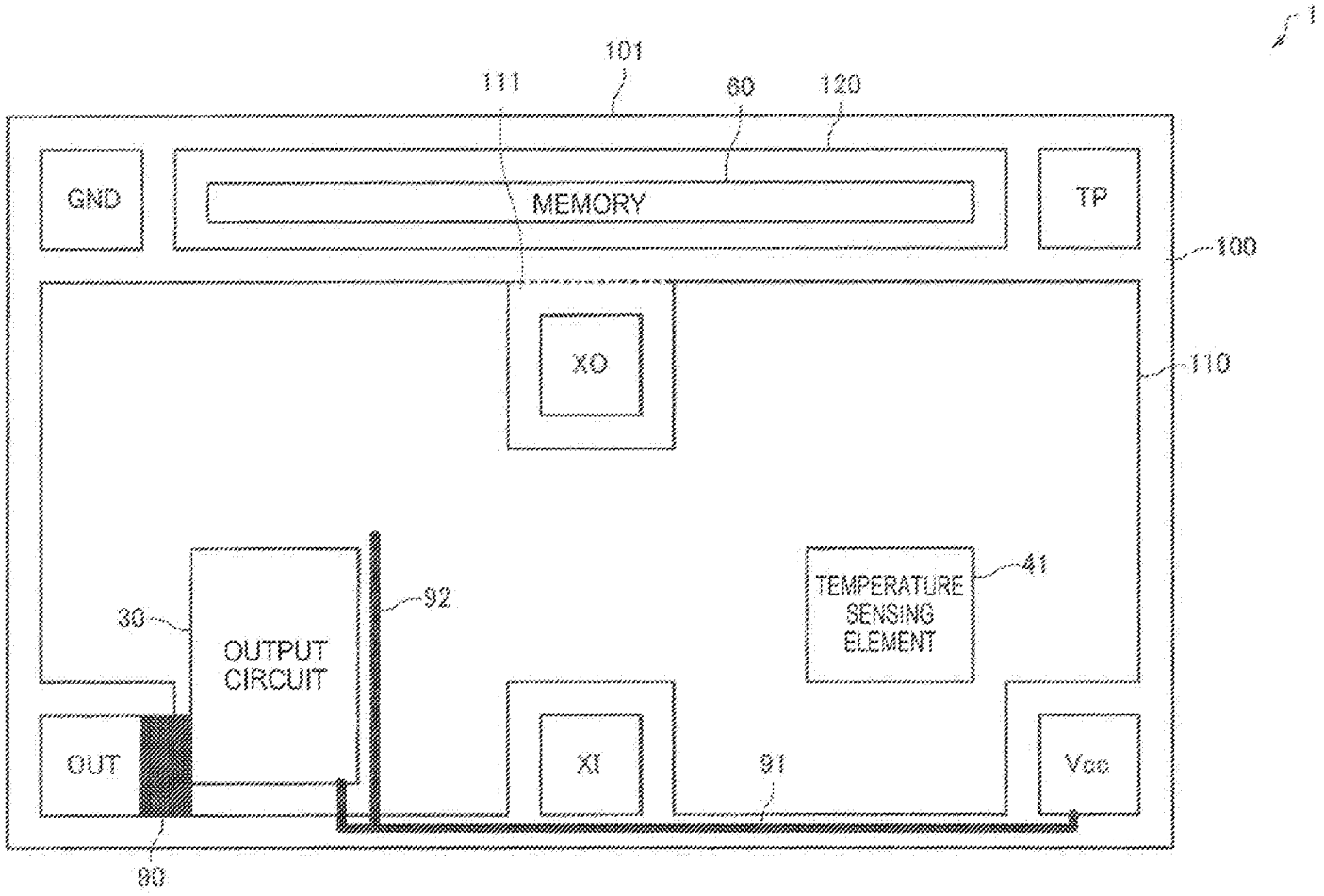
FIG. 10 is a plan view schematically illustrating a layout configuration of the semiconductor circuit device related to a third specific example.

FIG. 10 is a plan view schematically illustrating a layout configuration of the semiconductor circuit device 1 related to a third specific example. In FIG. 10, some of the circuits included in the semiconductor circuit device 1 are not illustrated. The same constituent elements as in the first and second specific examples are given the same reference numerals, and detailed description thereof will be omitted.

As illustrated in FIG. 10, in the present specific example, the semiconductor circuit device 1 further includes a second wiring 92 which intersects a virtual straight line which connects the output circuit 30 to the temperature sensing element 41 in a plan view. The second wiring 92 is electrically connected to the connection terminal Vcc (second connection terminal). The virtual straight line is a straight line which connects a virtual point inside the output circuit 30 to a virtual point inside the temperature sensing element 41, and may or may not be the shortest straight line. The virtual straight line may be a straight line which connects a diagram center (centroid) in a case where the region in which the output circuit 30 is disposed is viewed from the top to a diagram center (centroid) in a case where the region in which the temperature sensing element 41 is disposed is viewed from the top.

According to the present specific example, heat generated from the output circuit 30 is transferred to the temperature sensing element 41 along the above-described virtual straight line and is thus also transferred to the second wiring 92 intersecting the virtual straight line. Therefore, at least some of the heat generated from the output circuit is dissipated to the connection terminal Vcc (second connection terminal) via the second wiring 92. Consequently, the temperature sensing element 41 is unlikely to be influenced by the heat generated from the output circuit 30. Therefore, since the temperature sensing element 41 can accurately detect a temperature of the oscillation circuit 10, it is possible to implement the semiconductor circuit device 1 which can reduce frequency fluctuation during activation, for example, when an oscillator is configured. In the present specific example, although the output circuit 30 is exemplified as a circuit generating heat, the invention is not limited thereto, and the circuit generating heat may be a circuit which generates heat during an operation thereof, for example, the oscillation circuit 10, or an amplifying circuit which receives a signal from the oscillation circuit 10 and amplifies and outputs the signal.

Also in the third specific example, the same effects can be achieved for the same reason as described in the first specific example.

1-2-4. Fourth Specific Example

Figure 11:
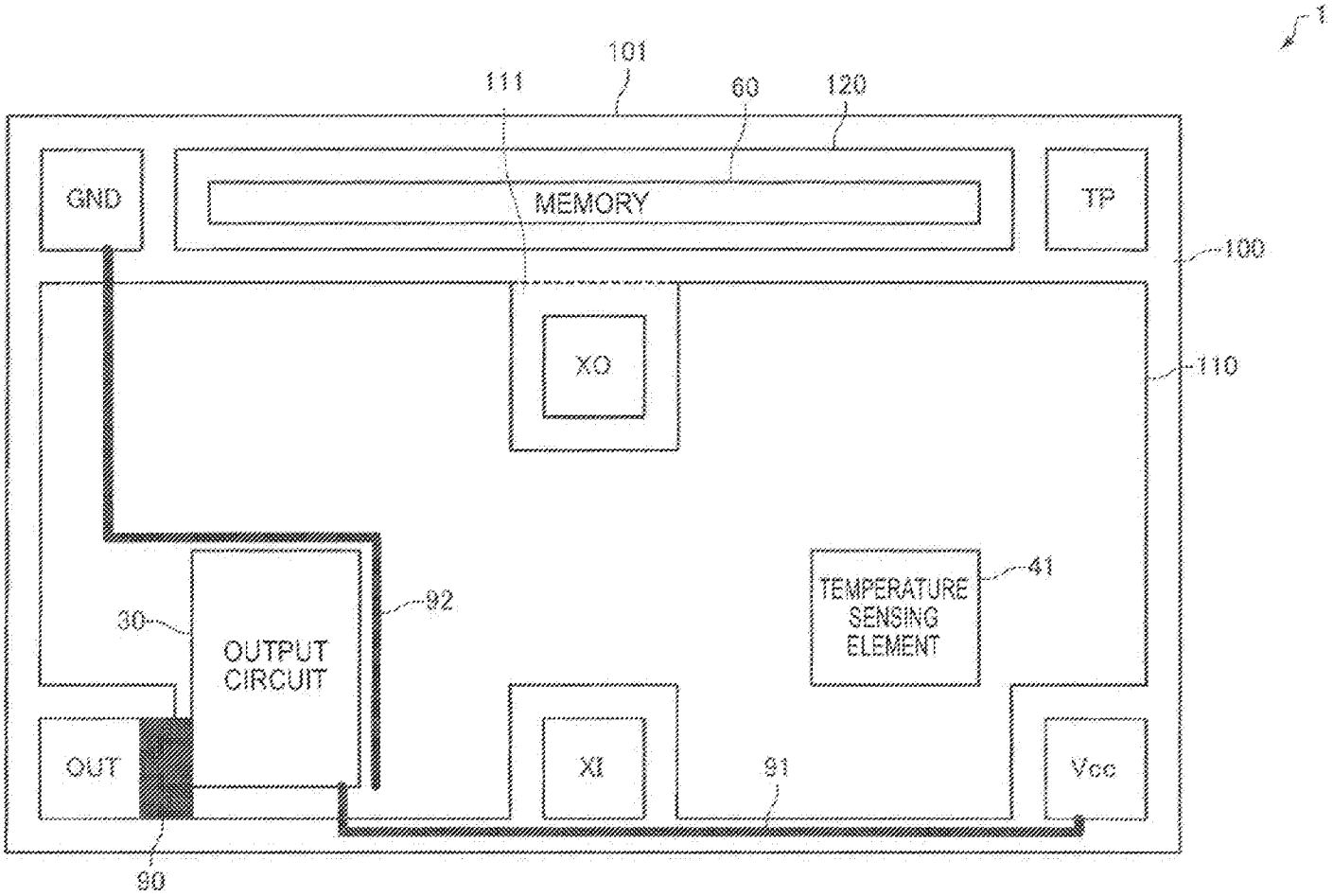
FIG. 11 is a plan view schematically illustrating a layout configuration of the semiconductor circuit device related to a fourth specific example.

FIG. 11 is a plan view schematically illustrating a layout configuration of the semiconductor circuit device 1 related to a fourth specific example. In FIG. 11, some of the circuits included in the semiconductor circuit device 1 are not illustrated. The same constituent elements as in the first to third specific examples are given the same reference numerals, and detailed description thereof will be omitted.

As illustrated in FIG. 11, in the present specific example, the semiconductor circuit device 1 further includes a second wiring 92 which intersects a virtual straight line which connects the output circuit 30 to the temperature sensing element 41 in a plan view. The second wiring 92 is electrically connected to the connection terminal GND (third connection terminal). The virtual straight line is a straight line which connects a virtual point inside the output circuit 30 to a virtual point inside the temperature sensing element 41, and may or may not be the shortest straight line. The virtual straight line may be a straight line which connects a diagram center (centroid) in a case where the region in which the output circuit 30 is disposed is viewed from the top to a diagram center (centroid) in a case where the region in which the temperature sensing element 41 is disposed is viewed from the top.

According to the present specific example, heat generated from the output circuit 30 is transferred to the temperature sensing element 41 along the above-described virtual straight line and is thus also transferred to the second wiring 92 intersecting the virtual straight line. Therefore, at least some of the heat generated from the output circuit is dissipated to the connection terminal GND (third connection terminal) via the second wiring 92. Consequently, the temperature sensing element 41 is unlikely to be influenced by the heat generated from the output circuit 30. Therefore, since the temperature sensing element 41 can accurately detect a temperature of the oscillation circuit 10, it is possible to implement the semiconductor circuit device 1 which can reduce frequency fluctuation during activation, for example, when an oscillator is configured. In the present specific example, although the output circuit 30 is exemplified as a circuit generating heat, the invention is not limited thereto, and the circuit generating heat may be a circuit which generates heat during an operation thereof, for example, the oscillation circuit 10, or an amplifying circuit which receives a signal from the oscillation circuit 10 and amplifies and outputs the signal.

Also in the fourth specific example, the same effects can be achieved for the same reason as described in the first specific example.

2. Oscillator

Figure 12:
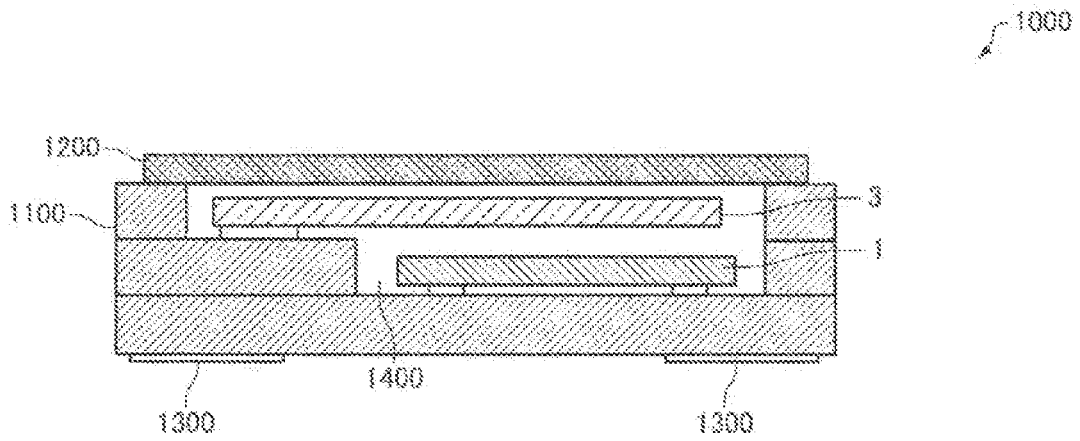
FIG. 12 is a sectional view schematically illustrating an oscillator according to the present embodiment.

FIG. 12 is a sectional view schematically illustrating an oscillator 1000 according to the present embodiment. The oscillator 1000 is configured to include the semiconductor circuit device 1, the resonator 3, and a container 1100 which accommodates the semiconductor circuit device 1 and the resonator 3. In the example illustrated in FIG. 12, the oscillator 1000 includes the container 1100 which accommodates the semiconductor circuit device 1 and the resonator 3 in the same space. In the example illustrated in FIG. 12, the oscillator 1000 is configured to include a lid 1200 and electrodes 1300. In the example illustrated in FIG. 12, the semiconductor circuit device 1 is formed of one chip. The resonator 3 may be a quartz crystal resonator in which quartz crystal is used as a substrate material, for example, an AT cut or SC cut quartz crystal resonator, a surface acoustic wave (SAW) resonator, or a micro electromechanical system (MEMS) resonator. As substrate materials of the resonator 3, not only quartz crystal but also piezoelectric materials including piezoelectric single crystals such as Lithium Tantalate or Lithium Niobate, or piezoelectric ceramics such as Zirconate Titanate, or silicon semiconductor materials may be used. As a method of exciting the resonator 3, a method using a piezoelectric effect may be used, or electrostatic driving using a Coulomb force may be used. The resonator 3 of the present embodiment is a chip-like element obtained by dividing a substrate material into individual pieces but is not limited thereto, and a resonance device may be used in which a chip-like element is enclosed in a container.

A depression is provided in the container 1100, and the depression is covered with the lid 1200 so that an accommodation chamber 1400 is formed. In the container 1100, wirings and terminals for electrically connecting the semiconductor circuit device 1 and the resonator 3 to each other are provided on a surface of the depression or inside the container 1100. The electrodes 1300 which are respectively electrically connected to at least the connection terminal Vcc, the connection terminal GND, the connection terminal OUT, and the connection terminal TP of the semiconductor circuit device 1 are provided in the container 1100.

Figure 13:
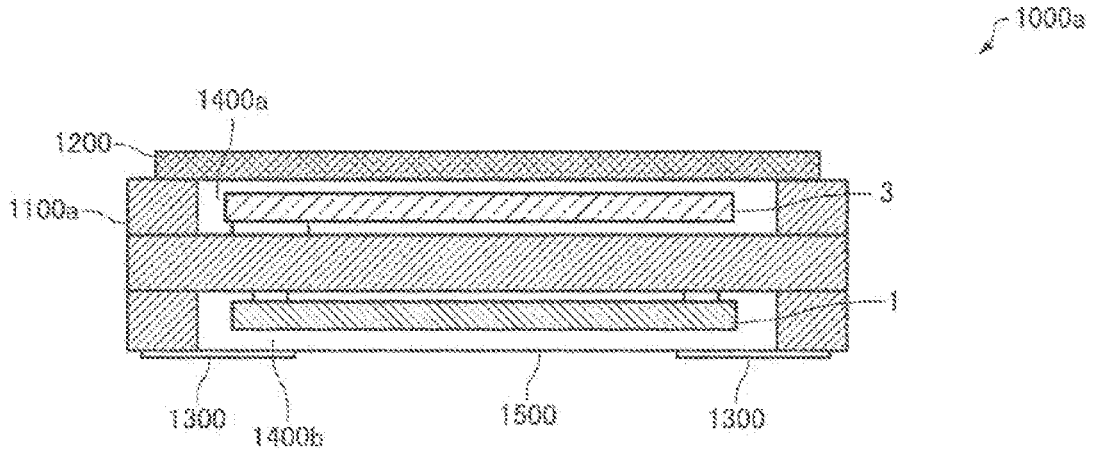
FIG. 13 is a sectional view schematically illustrating an oscillator according to a modification example.

FIG. 13 is a sectional view schematically illustrating an oscillator 1000a according to a modification example. The oscillator 1000a is configured to include the semiconductor circuit device 1, the resonator 3, and a container 1100a which accommodates the semiconductor circuit device 1 and the resonator 3. In the example illustrated in FIG. 13, the oscillator 1000a includes the container 1100a which accommodates the semiconductor circuit device 1 and the resonator 3 in different spaces. In the example illustrated in FIG. 13, the oscillator 1000a is configured to include a lid 1200, electrodes 1300, and a sealing member 1500. In the example illustrated in FIG. 13, the semiconductor circuit device 1 is formed of one chip. The resonator 3 may be a quartz crystal resonator in which quartz crystal is used as a substrate material, for example, an AT cut or SC cut quartz crystal resonator, a surface acoustic wave (SAW) resonator, or a micro electromechanical system (MEMS) resonator. As substrate materials of the resonator 3, not only quartz crystal but also piezoelectric materials including piezoelectric single crystals such as Lithium Tantalate or Lithium Niobate, or piezoelectric ceramics such as Zirconate Titanate, or silicon semiconductor materials may be used. As a method of exciting the resonator 3, a method using a piezoelectric effect may be used, or electrostatic driving using a Coulomb force may be used. The resonator 3 of the present modification example is a chip-like element obtained by dividing a substrate material into individual pieces but is not limited thereto, and a resonance device may be used in which a chip-like element is enclosed in a container.

Two depressions are provided on two opposing surfaces in the container 1100a. One depression is covered with the lid 1200 so that an accommodation chamber 1400a is formed, and the other depression is covered with the sealing member 1500 so that an accommodation chamber 1400b is formed. In the example illustrated in FIG. 13, the resonator 3 is accommodated in the accommodation chamber 1400a, and the semiconductor circuit device 1 is accommodated in the accommodation chamber 1400b. In the container 1100a, wirings and terminals for electrically connecting the semiconductor circuit device 1 and the resonator 3 to each other are provided on a surface of the depression or inside the container 1100a. The electrodes 1300 which are respectively electrically connected to at least the connection terminal Vcc, the connection terminal GND, the connection terminal OUT, and the connection terminal TP of the semiconductor circuit device 1 are provided in the container 1100a.

According to the oscillator 1000 and the oscillator 1000a of the present embodiment, since the oscillation circuit 10 is unlikely to be influenced by heat generated from the output circuit 30, and the temperature sensing element 41 can accurately detect a temperature of the oscillation circuit 10, it is possible to implement the oscillator 1000 and the oscillator 1000a which can reduce frequency fluctuation during activation, for example.

3. Electronic Apparatus

Figure 14:
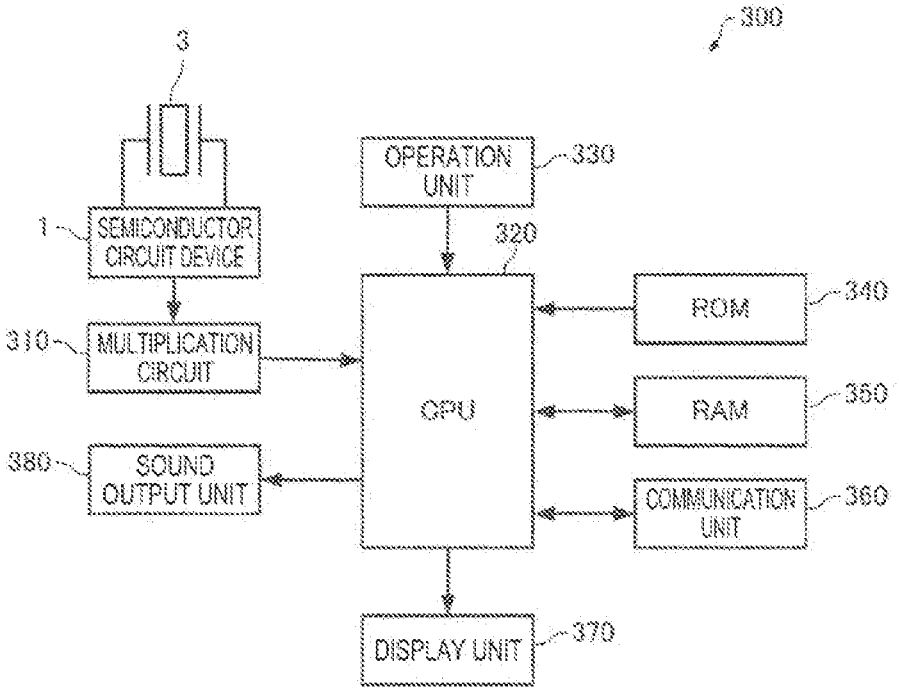
FIG. 14 is a functional block diagram of an electronic apparatus according to the present embodiment.

FIG. 14 is a functional block diagram of an electronic apparatus 300 according to the present embodiment. The same constituent elements as described in the embodiment are given the same reference numerals, and detailed description thereof will be omitted.

The electronic apparatus 300 of the present embodiment includes the semiconductor circuit device 1. In the example illustrated in FIG. 14, the electronic apparatus 300 is configured to include the resonator 3, the semiconductor circuit device 1, a multiplication circuit 310, a central processing unit (CPU) 320, an operation unit 330, a read only memory (ROM) 340, a random access memory (RAM) 350, a communication unit 360, a display unit 370, and a sound output unit 380. The electronic apparatus 300 of the present embodiment may have a configuration in which some of the above-described constituent elements (the respective units) illustrated in FIG. 14 are omitted or changed, or other constituent elements are added thereto.

The multiplication circuit 310 supplies a clock pulse to the CPU 320 and the respective units (not illustrated). The clock pulse may be, for example, a signal in which a desired harmonic signal is extracted from an oscillation signal output from the semiconductor circuit device 1 connected to the resonator 3 by using the multiplication circuit 310, and may be a signal in which the oscillation signal output from the semiconductor circuit device 1 is multiplied in the multiplication circuit 310 including a PLL synthesizer (not illustrated).

The CPU 320 performs various computation processes or control processes by using the clock pulse output from the multiplication circuit 310 according to a program stored in the ROM 340 or the like. Specifically, the CPU 320 performs various processes corresponding to operation signals from the operation unit 330, a process of controlling the communication unit 360 in order to perform data communication with external devices, a process of transmitting a display signal for displaying various information pieces on the display unit 370, a process of causing the sound output unit 380 to output various items of sound, and the like.

The operation unit 330 is an input device which is constituted of operation keys or button switches, and outputs an operation signal corresponding to a user's operation to the CPU 320.

The ROM 340 stores programs or data required for the CPU 320 to perform the various computation processes or control processes.

The RAM 350 is used as a work area of the CPU 320, and temporarily stores programs or data read from the ROM 340, data which is input from the operation unit 330, results of calculation executed by the CPU 320 according to the various programs, and the like.

The communication unit 360 performs various control processes for establishing data communication between the CPU 320 and an external device.

The display unit 370 is a display device constituted of a liquid crystal display (LCD) or an electrophoretic display, and displays various information pieces on the basis of display signals which are input from the CPU 320.

The sound output unit 380 is a device such as a speaker which outputs sound.

According to the electronic apparatus 300 of the present embodiment, since the semiconductor circuit device 1 which can reduce frequency fluctuation during activation is used when an oscillator is configured, it is possible to implement the electronic apparatus 300 with high reliability.

There may be various electronic apparatuses as the electronic apparatus 300. The various electronic apparatuses may be, for example, a personal computer (for example, a mobile type personal computer, a laptop type personal computer, or a tablet type personal computer), a mobile terminal such as a mobile phone, a digital camera, an ink jet type ejection apparatus (for example, an ink jet printer), a storage area network apparatus such as a router or a switch, a local area network apparatus, a mobile terminal base station apparatus, a television, a video camera, a video recorder, a car navigation apparatus, a pager, an electronic organizer (including a communication function), an electronic dictionary, an electronic calculator, an electronic gaming machine, a gaming controller, a wordprocessor, a workstation, a videophone, a security television monitor, electronic binoculars, a point of sale (POS) terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, a head mounted display, a motion tracer, a motion tracker, a motion controller, and a pedestrian dead reckoning (PDR) apparatus.

Figure 15:
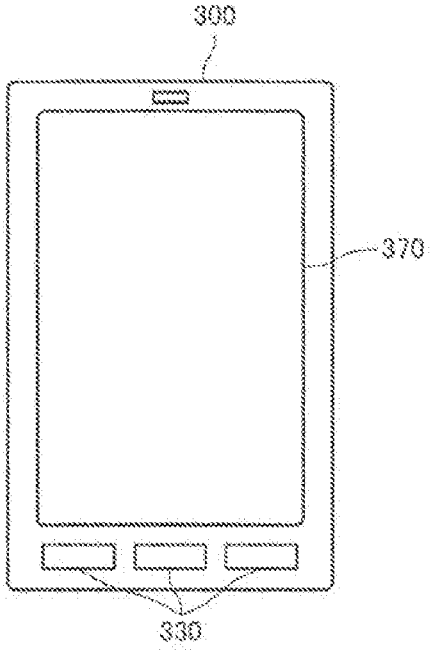
FIG. 15 is a diagram illustrating an example of an exterior of a smart phone which is an example of the electronic apparatus.

FIG. 15 is a diagram illustrating an example of an exterior of a smart phone which is an example of the electronic apparatus 300. The smart phone as the electronic apparatus 300 includes buttons as the operation unit 330 and an LCD as the display unit 370. Since the smart phone as the electronic apparatus 300 uses the semiconductor circuit device 1 which can reduce frequency fluctuation during activation when an oscillator is configured, it is possible to implement the electronic apparatus 300 with high reliability.

4. Moving Object

Figure 16:
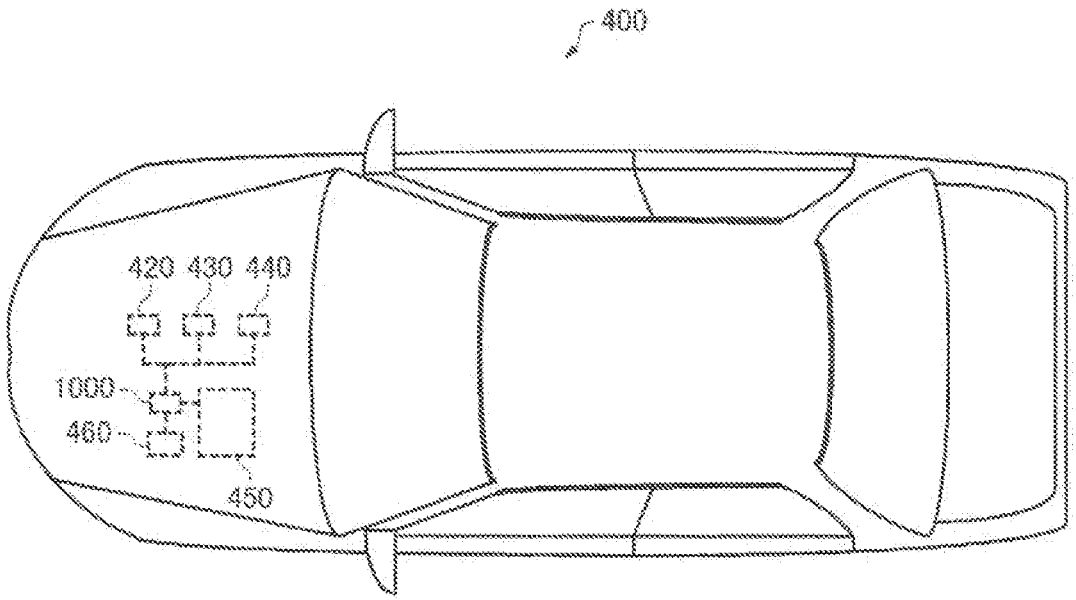
FIG. 16 is a diagram (top view) illustrating an example of a moving object according to the present embodiment.

FIG. 16 is a diagram (top view) illustrating an example of a moving object 400 according to the present embodiment. The same constituent elements as described in the embodiment are given the same reference numerals, and detailed description thereof will be omitted.

The moving object 400 of the present embodiment includes the oscillator 1000 using the semiconductor circuit device 1. FIG. 16 illustrates the moving object 400 including the oscillator 1000. In the example illustrated in FIG. 16, the moving object 400 is configured to include a controller 420, a controller 430, and a controller 440 which perform various control processes on an engine system, a brake system, a keyless entry system, and the like, a battery 450, and a backup battery 460. The moving object 400 of the present embodiment may have a configuration in which some of the above-described constituent elements (the respective units) illustrated in FIG. 16 are omitted or changed, or other constituent elements are added thereto.

According to the moving object 400 of the present embodiment, since the semiconductor circuit device 1 which can reduce frequency fluctuation during activation is used when an oscillator is configured, it is possible to implement the moving object 400 with high reliability.

There may be various moving objects as the moving object 400. The various moving objects may be, for example, an automobile (including an electric car), an aircraft such as a jet plane or a helicopter, a ship, a rocket and an artificial satellite.

The invention is not limited to the present embodiment and may be variously modified within the scope without departing from the spirit of the invention.

For example, in the above-described embodiment, the oscillator (TCXO) including the temperature compensation circuit as a characteristic adjustment circuit has been exemplified, but the invention is applicable to various oscillators such as an oscillator (an SPXO or the like) which includes a frequency adjustment circuit as the characteristic adjustment circuit, and an oscillator (a VCXO, a VC-TCXO, or the like) which includes an automatic frequency control (AFC) circuit as the characteristic adjustment circuit.

The above-described embodiment and modification example are only examples, and the invention is not limited thereto. For example, the embodiment and the modification example may be combined with each other as appropriate.

For example, the invention includes substantially the same configuration (for example, a configuration in which functions, methods, and results are the same, or a configuration in which objects and effects are the same) as the configuration described in the embodiment. The invention includes a configuration in which an inessential part of the configuration described in the embodiment is replaced with another part. The invention includes a configuration which achieves the same operation and effect or a configuration capable of achieving the same object as in the configuration described in the embodiment. The invention includes a configuration in which a well-known technique is added to the configuration described in the embodiment.

The entire disclosure of Japanese Patent Application No. 2015-010414, filed Jan. 22, 2015 is expressly incorporated by reference herein.

What is claimed is:

1. A semiconductor circuit device comprising:

an oscillation circuit that is connected to a resonator and causes the resonator to oscillate;

an output circuit that receives a signal output from the oscillation circuit and that outputs an oscillation signal, wherein the output circuit includes a frequency division circuit that determines whether or not a frequency of the output oscillation signal should be divided, and that performs the frequency division if it is determined that the frequency of the output oscillation signal should be divided;

a temperature sensing element;

a characteristic adjustment circuit that adjusts characteristics of the oscillation circuit on the basis of a signal output from the temperature sensing element;

a first connection terminal that is electrically connected to the output circuit and via which the oscillation signal is output; and a semiconductor substrate on which the circuits, the temperature sensing element, and the first connection terminal are provided, wherein a distance between the output circuit and the first connection terminal is shorter than a distance between the temperature sensing element and the first connection terminal in a plan view.

2. The semiconductor circuit device according to claim 1, further comprising: a first wiring that intersects a virtual straight line connecting the output circuit and the temperature sensing element to each other in a plan view, wherein the first wiring is electrically connected to the first connection terminal.

3. An oscillator comprising:

the semiconductor circuit device according to claim 2;

the resonator; and a container that accommodates the semiconductor circuit device and the resonator.

4. An electronic apparatus comprising the semiconductor circuit device according to claim 2.

5. A moving object comprising the semiconductor circuit device according to claim 2.

6. The semiconductor circuit device according to claim 2, further comprising:

a second connection terminal via which power for operating the output circuit is supplied to the output circuit; and a second wiring via which the output circuit is electrically connected to the second connection terminal, wherein the second wiring and the temperature sensing element do not overlap each other in a plan view.

7. An oscillator comprising:

the semiconductor circuit device according to claim 6;

the resonator; and a container that accommodates the semiconductor circuit device and the resonator.

8. An electronic apparatus comprising the semiconductor circuit device according to claim 6.

9. A moving object comprising the semiconductor circuit device according to claim 6.

10. The semiconductor circuit device according to claim 6, the first wiring is thicker than the second wiring in order to reduce thermal resistance.

11. The semiconductor circuit device according to claim 1, further comprising: a memory that stores data for controlling at least one of the oscillation circuit, the output circuit, and the characteristic adjustment circuit.

12. The semiconductor circuit device according to claim 1, wherein the characteristic adjustment circuit is a temperature compensation circuit.

13. An oscillator comprising:

the semiconductor circuit device according to claim 1;

the resonator; and a container that accommodates the semiconductor circuit device and the resonator.

14. An electronic apparatus comprising the semiconductor circuit device according to claim 1.

15. A moving object comprising the semiconductor circuit device according to claim 1.

16. The semiconductor circuit device according to claim 1, wherein the output circuit and the power source supply terminal are connected by a wire, another connection terminal is arranged between the output circuit and the power source supply terminal, and the other connection terminal is connected to or near the wire.

17. The semiconductor circuit device according to claim 1, wherein the output circuit receives power from a power supply.

18. The semiconductor circuit device according to claim 1, wherein the output circuit further comprises an amplitude control circuit, and the amplitude control circuit causes a static current to flow during adjustment of the temperature compensation circuit, so as to generate heat corresponding to heat which is generated from the output circuit during normal operation.

*19. An oscillator comprising:*

*a container having a first depression and a second depression;*

*a lid covering the second depression;*

*a resonator disposed in the second depression; and*

*a semiconductor circuit device disposed in the first depression and electrically coupled to the resonator, the semiconductor circuit device comprising:*

*an oscillation circuit that is connected to the resonator and causes the resonator to oscillate;*

*an output circuit that receives a signal output from the oscillation circuit and that outputs an oscillation signal, wherein the output circuit includes a frequency division circuit that determines whether or not a frequency of the output oscillation signal should be divided, and that performs the frequency division if it is determined that the frequency of the output oscillation signal should be divided;*

*a temperature sensing element;*

*a characteristic adjustment circuit that adjusts characteristics of the oscillation circuit on the basis of a signal output from the temperature sensing element;*

*a first connection terminal that is electrically connected to the output circuit and via which the oscillation signal is output; and*

*a semiconductor substrate on which the circuits, the temperature sensing element, and the first connection terminal are provided, wherein a distance between the output circuit and the first connection terminal is shorter than a distance between the temperature sensing element and the first connection terminal in a plan view.*

*20. The oscillator of claim 19, wherein the container includes an electrode electrically connected to the first connection terminal.*

*21. The oscillator of claim 20, wherein a distance between the electrode and the semiconductor circuit device is smaller than a distance between the electrode and the resonator.*

*22. The oscillator of claim 19, wherein the resonator and the semiconductor circuit device overlap in the plan view, and a single container layer is disposed between the resonator and the semiconductor circuit device.*

*23. The oscillator of claim 22, wherein a thickness of the single container layer is larger than a thickness of the resonator, and larger than a thickness of the semiconductor circuit device.*

* * * * *